United States Patent [19]

Hodes et al.

[11] Patent Number: 4,830,933
[45] Date of Patent: May 16, 1989

[54] COMPOSITE STRUCTURAL MATERIAL WITH DIFFUSION BARRIER LAYER, ESPECIALLY FOR SLIDE AND FRICTION MEMBERS, AND METHOD OF MANUFACTURE

[75] Inventors: Erich Hodes, Rosbach; Klaus Goerke, Jugenheim, both of Fed. Rep. of Germany

[73] Assignee: Glyco-Metall-Werke Daelen & Loos GmbH, Wiesbaden, Fed. Rep. of Germany

[21] Appl. No.: 2,448

[22] Filed: Jan. 12, 1987

[30] Foreign Application Priority Data

Jan. 20, 1986 [DE] Fed. Rep. of Germany ....... 3601438

[51] Int. Cl.4 ............................ B32B 15/01; C23C 14/34
[52] U.S. Cl. ............................. 428/646; 204/192.15; 204/192.3; 428/660
[58] Field of Search ............. 204/192.12, 192.15, 204/192.16, 192.2, 192.3; 428/615, 645, 646, 649, 660, 687; 384/912

[56] References Cited

U.S. PATENT DOCUMENTS

| | | | |
|---|---|---|---|
| 3,911,579 | 10/1975 | Lane et al. | 204/192.16 X |
| 4,074,016 | 2/1978 | Trippel | 428/660 X |
| 4,245,008 | 1/1981 | Michaelsen et al. | 428/611 |
| 4,363,854 | 12/1982 | Hodes et al. | 428/687 X |
| 4,404,263 | 9/1983 | Hodes et al. | 204/192.15 X |
| 4,448,854 | 5/1984 | Schuller et al. | 428/660 X |
| 4,591,536 | 5/1986 | Hodes et al. | 428/645 X |
| 4,619,865 | 10/1986 | Keen et al. | 204/192.16 X |

FOREIGN PATENT DOCUMENTS 2853724 7/1981 Fed. Rep. of Germany.
2914618 9/1983 Fed. Rep. of Germany.

OTHER PUBLICATIONS

K. Kobayshi et al., "High Density . . . Disks", Fujitsu Sci. Tech. J., 19, 1, pp. 99–126, 3/83.

Primary Examiner—Nam X. Nguyen
Attorney, Agent, or Firm—H. Gibner Lehmann; K. Gibner Lehmann

[57] ABSTRACT

A composite structural material particularly intended for frictional and slide elements, consisting of a substrate such as a steel layer with a copper- or tin-containing intermediate layer, a tin- or copper-containing functional layer and, between these last two layers, a diffusion barrier layer protecting against diffusion of tin from the functional layer into the intermediate layer or back to the diffusion barrier layer. The diffusion barrier layer consists of a metallic material having a hexagonal crystal lattice, which material is applied by cathodic sputtering, forming a material structure that is densely packed in vacuo with a space filling by metal ions of above 70%. For the cathodic sputtering, conditions of plasma pressure and substrate temperature can be chosen so that recrystallization occurs simultaneously with the formation of the diffusion barrier layer; this makes it possible to achieve the densest hexagonal packing, with a space filling of up to 74%. Pure titanium is the preferred material for the diffusion barrier layer.

18 Claims, 1 Drawing Sheet

COMPOSITE STRUCTURAL MATERIAL WITH DIFFUSION BARRIER LAYER, ESPECIALLY FOR SLIDE AND FRICTION MEMBERS, AND METHOD OF MANUFACTURE

CROSS REFERENCES TO RELATED APPLICATIONS

1. Ser. No. 07/002,647—Copending application of Erich Hodes and Klaus Goerke filed Jan. 12, 1987 and entitled Layered Composite Construction Material, Especially for Sliding and Friction Members, and Process for its Preparation, abandoned.

2. Ser. No. 07/005,434—Copending application of Erich Hodes and Klaus Goerke filed Jan. 12, 1987, and entitled Sliding or Frictional Member having its Functional component made from a Ceramic Material with Incorporated Stabilizer, and Process for Manufacture of the same, abandoned.

3. Ser. No. 07/002,544—Copending application of Erich Hodes and Klaus Goerke filed Jan. 12, 1987 and entitled Process for The Preparation of Layer Components by Sputtering at Least One Metallic Material Onto a Metallic Substrate, abandoned.

4. Ser. No. 07/002,447—Copending application of Erich Hodes and Klaus Goerke filed Jan. 12, 1987 and entitled Sliding or Frictional Member with its Functional Component Made from a Ceramic Material, abandoned.

STATEMENT AS TO RIGHTS TO INVENTIONS MADE UNDER FEDERALLY-SPONSORED RESEARCH AND DEVELOPMENT

Research and development of the present invention and application have not been Federally-sponsored, and no rights are given under any Federal program.

BACKGROUND OF THE INVENTION

1. FIELD OF THE INVENTION

This invention relates to composite structural materials, and especially to sliding and friction elements in which a functional layer, such as a coating containing tin and/or copper, constitutes a friction or slide surface layer, such layer being applied to a substrate of steel with an intermediate layer that contains copper and/or tin and which has a diffusion barrier coating with a thickness of 0.5 to 5 um.

2. DESCRIPTION OF THE RELATED ART INCLUDING INFORMATION DISCLOSED UNDER 37 CFR §§1.97-1.99

In known composite structural materials, such as those according to German Patent Publication DE-OS No. 28 53 724 there is provided an intermediate layer, such as of lead bronze, and on such intermediate layer a functional layer, such as a slide or friction coating. A thin oxide-free diffusion barrier layer is disposed between the intermediate and friction layers in order to prevent tin from diffusing from the friction layer into the intermediate layer at elevated temperatures. This is intended to counteract the formation of intermetallic brittle phases of tin and copper in those areas of the intermediate layer which are located in the vicinity of the slide and friction coating. Such brittle phases can cause detachment of the slide and friction layer under conditions of dynamic stress. The DE-OS Patent Publication No. 28 53 724 therefore proposes to provide a sputtered diffusion barrier layer of $NiCr_{20}$ or chromium between the intermediate layer and the slide or friction layer.

Practical experience has shown that the nickel-chromium diffusion barrier layer and also a pure chromium diffusion barrier layer is not fully effective in tin-containing slide or friction layers (e.g. from AlSn alloys). Studies on the electron microscope and the microprobe show that tin evidently diffuses into and over lattice void spaces through a diffusion barrier layer of $NiCr_{20}$ or pure chromium which had been prepared by cathode sputtering, such diffused tin combining with the copper of the lead bronze intermediate layer to create an intermetallic brittle phase, such as $Cu_6Sn_5$, which under conditions of practical operation will lead to detachment of the slide layer.

Conventional galvanically applied diffusion barrier coatings of all known material compositions have been proved ineffectual at elevated operating temperatures since they have a relatively large number of lattice void spaces and therefore allow considerable amounts of tin to diffuse from the functional slide or friction layers, into the intermediate layer. Conventional diffusion barrier layers were found to be inadequate, due to their characteristic substantially higher permeability for tin.

In addition to the example given above, a diffusion barrier layer should also prevent the diffusion of tin from a tin-containing intermediate layer into a copper containing functional layer. The prevention of tin diffusion in one or the other direction is of increasing importance in that machine elements need to be developed for higher operating temperatures because of the trend to increase the machine efficiency, particularly in combustion engines.

SUMMARY OF THE INVENTION

It is therefore the objective of the invention to substantially improve composite structural bearing materials for the purpose of practically preventing the diffusion of tin through the diffusion barrier layer, or at least to reduce it substantially, in particular at elevated temperature.

This objective is solved in accordance with the invention in that the diffusion barrier layer is made of a material forming a hexagonal crystal lattice, and that the diffusion barrier layer is formed by cathode sputtering in vacuo to form a structural material characterized by close packing whereby space filling above 70% by metal ions is obtained.

By the provision of a diffusion barrier layer made according to the invention from a material having essentially a hexagonal lattice structure and with the aid of cathode sputtering, as experiments have shown surprisingly, detachment of the functional layer from the intermediate layer is reliably avoided even at high operating temperatures, such as at 200° C. and higher.

In a preferred way of executing the invention, the diffusion barrier layer is formed with practically a vacancy-free recrystallized structure of the hexagonal crystal lattice. In such case, optimal space filling by metal ions reaches about 74%; diffusion of tin through such a diffusion barrier layer is made practically impossible, even at elevated temperatures.

Metals from the group including titanium, zirconium, hafnium, thorium, beryllium, magnesium or alloys containing at least one of these metals are particularly suited for the formation of the diffusion barrier layer. Especially advantageous is the formation of the diffusion barrier layer from pure titanium, which has been shown to be suitable for the formation of a highly effective diffusion barrier layer and also has advantageous properties for the pretreatment and formation of a target useful for cathode sputtering.

Preferably, the functional layer is applied immediately to the diffusion barrier layer by a subsequent cathode sputtering in vacuo. Thus, there are no vacancies or deposits of foreign matter in the interface between the diffusion barrier layer and the functional layer, which could disturb the especially dense crystal lattice structure of the diffusion barrier layer.

Composite structural materials according to the invention can be prepared advantageously and favorably in the process according to the invention, characterizd by subjecting the substrate which is already coated with the intermediate layer, to purification or pickling of the free surface of the intermediate layer by reverse cathode sputtering in vacuo, followed immediately by applying the diffusion barrier layer to cathode sputtering while maintaining the necessary conditions of substrate temperature and plasma pressure in accordance with the desired structure of the diffusion barrier layer. It has been found that at the highest possible temperature of the surface to be coated and the lowest possible plasma pressure in the receiver, the material particles which are transported to the coating surface by the cathode sputtering process have essentially atomic dimensions; they are transported to the coating surface with high kinetic energy. After impingement on the coating surface the transported particles or atoms retain considerable mobility; they detach at least partially from the impingement site of the surface and arrange themselves in the fashion of a recrystallization process into the structure typical for the material, i.e. hexagonal crystal lattices with a high degree of packing. At high temperatures, e.g., above 600° C. and high relative particle mobility a steady recrystallization process can be maintained in the already-formed portions of the coating, simultaneously with the formation of the diffusion barrier layer; thus, dense packing with a 74% space filling by a structure approaching metal ions is achieved.

Intrinsically, the temperature of the coating surface is limited by the composition of the intermediate layer, due to the fact that components of the intermediate layer, such as lead, vaporize above a temperature threshold. This can be counteracted in the process according to the invention by increasing the substrate temperature at the coating surface during the formation of the diffusion barrier layer when the latter reaches the thickness of one or more atomic layers; this can counteract the vaporization of components from the intermediate layer.

The mobility of the particles impinging on the coating surface of the intermediate layer by cathode sputtering is also kept at a high value by operating at the lowest possible plasma pressure in the receiver which minimizes the number of collisions of cathode sputtered particles and atoms with plasma particles. On the other hand, excessive reduction of the plasma pressure will make the anomalous corona discharge, which constitutes the physical vehicle of cathode sputtering, so weak that the electric current and thus the through-put efficiency of cathode sputtering drops excessively. It has been found, however, that the physical operating conditions of cathode sputtering may be adjusted and tuned before reaching this limit so that the formation of the diffusion barrier layer still takes place in the fashion of a recrystallization process.

A further improvement in the density of the forming diffusion barrier layer can be achieved when a negative electrical voltage is applied to the substrate during the formation of the diffusion barrier layer; this voltage is lower by one order of magnitude than the negative electrical voltage applied to the target. However, one would have to expect that gas particles or other foreign particles may be embedded in the structure of the diffusion barrier layer, forming undesirable vacancies. This can be effectively counteracted by interaction with the high temperature and relatively low plasma pressure on the coating surface.

Heating of the substrate to the temperature desired for the formation of the diffusion barrier layer can be carried out during the reverse cathode sputtering applied for purification or pickling of the free surface of the intermediate layer. Indeed, the reverse cathode sputtering itself can be used for reaching the desired temperature of the substrate, either by itself or with the aid of additional energy input, such as infrared radiation or induction heating; however the latter is less applicable when cathode sputtering is carried out in a magentic field. The substrate and the forming diffusion barrier layer also can be postheated in the course of cathode sputtering for the formation of the diffusion barrier layer; for instance, the coating surface can be heated by infrared irradiation. To achieve high efficiency in cathode sputtering and a high impingement rate of the particles or atoms on the coating surface it is recommended within the scope of the invention to carry out the formation of the diffusinn barrier layer by cathode sputtering in a magnetic field.

The application of the functional layer to the diffusion barrier layer side can be carried out by cathode sputtering immediately following the application of the diffusion barrier layer. There is the possibility of transition to cathode sputtering by other materials such as the material provided for the functional layer, also transition to other operating conditions with respect to the potential to be applied to the target and to the substrate, as well as with respect to the required plasma pressure, and with respect to the composition of the plasma. In order to apply the functional layer in a receiver to a material or material component simultaneously with the applying of the diffusion barrier layer to another material or material component, it is possible to provide separators or locks within the receiver by which the material components or a material ribbon can be transported from one separate range of the receiver to another.

If the formation of the functional coating must be effected with a plasma composition other than that used for the formation of the diffusion barrier layer, or if there is a danger that a plasma of another composition has a negative effect on the newly produced free surface of the diffusion barrier layer, the process within the scope of the invention embraces the applying first of a thin layer covering the diffusion barrier layer, using a plasma of a composition essentially equal to that used for the formation of the diffusion barrier layer on the free surface of the intermediate layer by cathode sputtering or ion plating, and this protective coating can be formed from the material already provided for the functional layer.

For the formation of a vacancy-free structure of the diffusion barrier layer it has been found particularly advantageous when the target and the material contained therein as used for the formation of the diffusion barrier layer by cathode sputtering, is subjected to a highly degassing pretreatment, so that the target materials used for the formation of the diffusion barrier layer are characterized by a particularly low gas content. This particularly intense degassing pretreatment of the material or materials contained in the target used for the formation of the diffusion barrier layer may consist in high vacuum melting and/or high vacuum annealing and/or high vacuum distillation.

Other features and advantages will hereinafter appear.

BRIEF DESCRIPTION OF THE DRAWINGS

An example of the invention is further illustrated by three drawings.

DESCRIPTION OF THE PREFERRED EMBODIMENT

Figure 1:
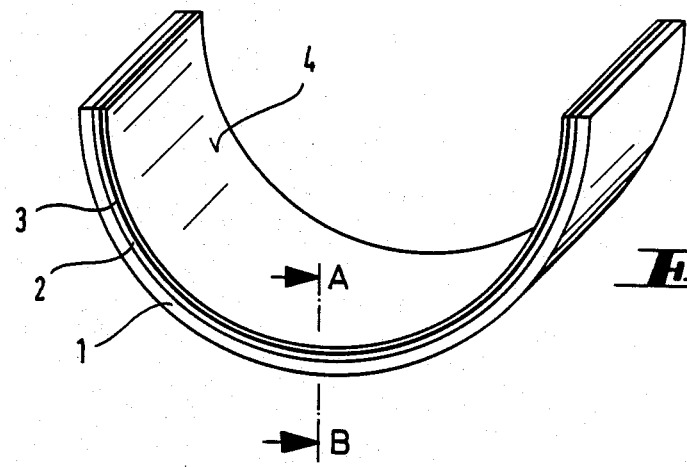
FIG. 1 is a perspective illustration of a slide bearing member formed from composite structural material in accordance with the invention.
Figure 2:
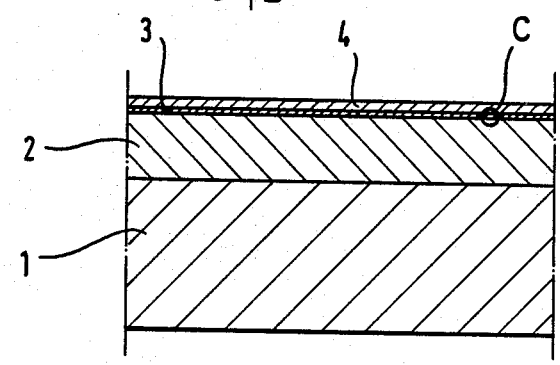
FIG. 2 is an enlarged cross-section in the location A-B of FIG. 1.

FIGS. 1 and 2 show a substrate layer 1 of steel on which there is an intermediate coating 2 made of copper-containing bearing material, such as lead bronze in a thickness of 0.2 to 0.7 um. The copper-containing bearing material of the intermediate layer 2 has a composition within conventional limits as customary for copper-containing bearing materials in intermediate layers of multilayer slide bearings. On the surface of the intermediate layer 2 which is not facing the carrier layer 1 there is applied a diffusion barrier layer 3 which in the illustration, may have a thickness of about 3 um. This diffusion barrier layer consists of a nickel-tin alloy with a 20% tin content. The diffusion barrier layer is applied to the free surface of the intermediate layer 2 by cathode sputtering. The slide layer 4 is applied to the free surface of the diffusion barrier layer by cathode sputtering in vacuo. The slide layer 4 consists of a tin-containing alloy or dispersion alloy. For example, tin-based alloys, such as $SnSb_{12}Cu_6Pb_2$ or alloys based on lead with noticeable tin contents, such as $PbSn_{10}Cu_2$ or $PbSn_{10}$ may be used as slide bearing alloys for the slide layer 4. However, the slide layer 4 can also be formed of a dispersion alloy, particularly those of an AlSn basis, especially $AlSn_6$, $AlSn_{10}$, $AlSn_{20}$, or $AlSn_{40}$.

In any case, the tin contained in the slide layer 4 normally tends to diffuse into the intermediate layer 2 and to combine with the copper present in that layer to form intermetallic phases, especially intermetallic brittle phases such as $Cu_6Sn_5$; this occurs more frequently with increasing operating temperature of the slide bearing. Conventional diffusion barrier layers, especially galvanically applied diffusion barrier layers, can considerably retard the diffusion of tin at low temperature. At higher operating temperatures, however, such as in the range of 200° C. or higher, tin diffusion is practically unchecked from the slide layer through the conventional diffusion barrier layers into the copper-containing intermediate layer. This is explained by the fact that vacancies exist in conventional diffusion barrier layers to such an extent that tin atoms, more mobile due to the elevated temperature, can easily pass through the diffusion barrier layer.

Figure 3:
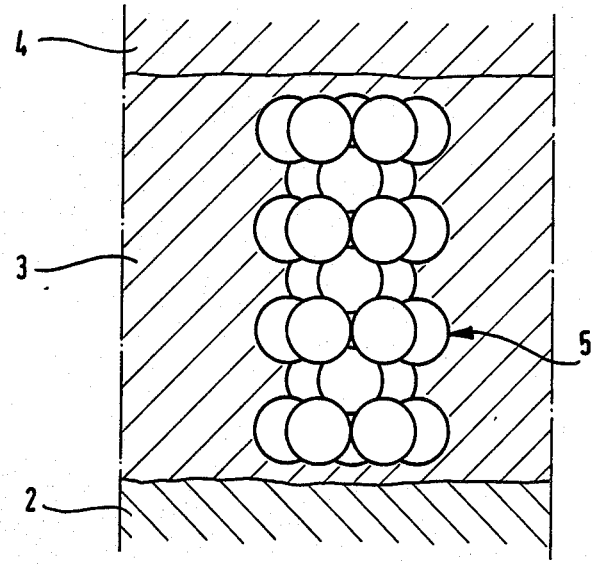
FIG. 3 is an enlargement of the sectional portion indicated at "C" in FIG. 2, showing the crystal lattice.

On the other hand, according to the invention, a practically vacancy-free dense packing above 70% is formed in the diffusion barrier 3 by metal ions made of a sputtered material forming a hexagonal crystal lattice. This crystal lattice structure can be developed to the optimum space filling at 74% by recrystallization that is operable simultaneously with the cathode sputtering; this is shown in FIG. 3 by the crystal lattice structure 5. By the formation of a hexagonal crystal lattice in a dense packing or by recrystallized structure in the densest packing, the diffusion barrier layer 3 as formed of pure titanium in the illustration presented, is practically impermeable for tin atoms at higher temperatures, such as 200° C. and above.

Instead of pure titanium as used in the presented example for the formation of the diffusion barrier coating 3, other metallic materials may be used which offer a hexagonal crystal lattice with the possibility of dense or densest packing. These include zirconium, hafnium, thorium, beryllium, magnesium or alloys from one or more of these metals. However, titanium offers particular advantages for this process which will be discussed in the scope of the following operation example.

EXAMPLE

A steel substrate 1 coated convetionally with the intermediate layer 2 made of copper-containing bearing material is mounted in a metallic support, which may be formed as a carriage (not shown) that is movable within a receiver separated into chambers which are used for cathode sputtering. The carriage can be heated by the circulation of a liquid heating medium, such as oil.

After placement into the receiver, the semi-finished material consisting of the carrier layer 1 and the intermediate layer 2, which have been placed on the carriage for heating, is ready for processing. The free surface of the intermediate layer is exposed and the substrate and its intermediate layer are heated by selecting the temperature of the liquid heating medium, and also degassed by evacuating the receiver until a vacuum of about $10^{-5}$ mbar is reached therein.

Following degassing of the semifinished material, plasma gas, preferably argon, is introduced into the receiver until a pressure of $5 \times 10^{-3}$ to $5 \times 10^{-2}$ is reached. This is followed by purification and roughening or etching of the free or exposed surface of the intermediate layer 2, effected by reverse cathode sputtering. The carriage having the semifinished material is used as a cathode; an anomalous corona discharge is produced by which an etch voltage of from 400 to 1000 V, preferably 500 V, is applied and an etch current of between 5 and 15 $mA/cm^2$ is maintained on the surface to be etched. During this reverse cathode sputtering, a substrate temperature of between 120° C. and 200° C., preferably 140° C., is reached and maintained by the combined effect of the liquid heating medium and the reverse cathode sputterigg. The duration of this etch treatment by reverse cathode sputtering must be selected by the requirements of each case.

After etching by reverse cathode sputtering, the application of the diffusion barrier layer is carried out by cathode sputtering. The carriage with its heating and cooling chamber connected for the circulation of the heating medium is used as an anode, having applied to it a negative potential of about 30 to 70 V.

This is followed by the application of the diffusion barrier layer by cathode sputtering with a target formed from the desired material of the diffusion barrier layer, for example a target of pure titanium sheeting. Such titaniu sheeting is easily available, and can be mechanically processed by simple means. Furthermore, a target of titanium sheeting can be simply subjected to the required pretreatments, such as degassing and surface purification, by preliminary sputtering, which is cathode sputtering on a screen facing the target.

During the formation of the diffusion barrier layer a potential difference of between 300 and 700 V is applied, as a sputter voltage to the semifinished material formed of the substrate layer 1 and intermediate layer. The sputter current maintained during the formation of the diffusion barrier layer amounts in this example to 50 to 150 A, or 10 to 30 W/cm$^2$ of the surface to be coated. The substrate and intermediate layer, i. e., the semifinished material to be coated, is kept during the formation of the diffusion barrier layer at a temperature of between 120° C. and 200° C., preferably 140° C., by means of the liquid heating medium led to the carriage. This is a temperature which the copper containing material of the intermediate layer 2 can withstand without vaporization or diffusion of alloy components. In this example, the temperature should be kept as constant as possible throughout the entire sputtering of the diffusion barrier layer, i. e., within the limits of $\pm 5°$ C. The plasma pressure in the receiver is kept within the range of between $1 \times 10^{-3}$ and $5 \times 10^{-3}$ mbar during the formation of the diffusion barrier layer 3 by the cathode sputtering. Under these temperature and pressure conditions a recrystallization process occurs within the forming diffusion barrier layer 3 by which the packing of the hexagonal metal lattice can be densified to the densest hexagonal packing and space filling, up to 74%.

Following the formation of the diffusion barrier layer 3, the formation of the functional or slide layer 4 is effected under practically identical conditions with respect to sputter voltage, sputter current, substrate temperature, and sputter pressure as previously used for the formation of the diffusion barrier layer, with the difference however that cathode sputtering takes place from a target, or from several targets as desired for the particular functional layer or slide layer 4 that is required. Furthermore, oxidic components are possibly created during the formation of the functional layer; these components can be embedded in the form of finest particles in the functional or slide layer for reinforcement of the dispersion, as known from German Publication DE-PS Nos. 28 53 724 and DE-PS 29 14 618. The required oxygen can be embedded in the target or can be added to the plasma. In any case, however, the diffusion barrier layer must be kept free of oxide components.

The process steps in the sample discussed above can be carried out in a simple receiver in sequence. However, it is possible to provide a receiver that is subdivided into chambers, equipped with locks between the chambers, in which the individual process steps are carried out. For instance there can be a chamber for degassing the semifinished material, followed by a chamber for purification and roughening of the coating surface by reverse cathode sputtering, followed by a chamber for the formation of the diffusion barrier layer 3, and a chamber for the production of the functional or slide layer 4. If the composite structural material is produced continuously in the shape of a ribbon, the layer material can be passed continuously to the receiver through an inlet lock and the composite structural material can be continuously removed from the receiver through an outlet lock. Furthermore, pieces of semifinished material of steel substrate 1 and intermediate layer 2 can be passed in sequence into the receiver through an inlet lock, and the respective composite structural materials can be taken from the receiver through an outlet lock while the process is maintained continuously within the receiver.

Variations and modifications are possible without departing from the spirit of the invention.

Each and every one of the appended claims defines an aspect of the invention which is separate and distinct from all others, and accordingly it is intended that each claim be treated in this manner when examined in the light of the prior art devices in any determination of novelty or validity.

List of symbols:
1 Substrate layer (steel)
2 Intermediate layer
3 Diffusion Barrier Layer
4 Slide layer (functional layer)
5 Metal lattice structure in the diffusion barrier layer

What is claimed is:

1. Composite structural material, especially for slide and friction members, comprising in combination a substrate layer; an intermediate layer on said substrate layer; a diffusion barrier layer of 0.5 to 5 um thickness on the intermediate layer; characterized in that a functional tin-based friction or slide layer constituted of material selected from the group consisting of tin-containing alloys is applied to the diffusion barrier layer, and further characterized in that the diffusion barrier layer (3) is a material having a hexagonal crystal lattice and is formed in vacuo by cathode sputtering and has a structure characterized by close packing of the voids of the lattice by metal ions, said attice having a space packing above 70% by said metal ions.

2. Composite structural material in accordance with claim 1, characterized in that the diffusion barrier layer is constituted as a practically voidless, recrystallized hexagonal crystal lattice structure.

3. Composite structural material according to claim 1, characterized in that the diffusion barrier layer (3) is selected from a material of the group of titanium, zirconium, hafnium, thorium, beryllium, magnesium or from an alloy containing at least one of these metals.

4. Composite structural material according to claim 1, characterized in that the diffusion barrier layer (3) is constituted essentially soley of titanium.

5. Composite structural material according to claim 1, characterized in that the functional layer is applied to the diffusion barrier layer by an immediately following cathode sputtering in vacuo.

6. Composite structural material in accordance with claim 1, wherein said tin-containing alloys are constituted of materials selected from the group consisting of $SnSb_{12}Cu_6Pb_2$, $PbSn_{10}Cu_2$, and $PbSn_{10}$.

7. A process for the preparation of a composite structural material of the type having a substrate layer; an intermediate layer on said substrate layer; a diffusion barrier layer comprising material having a hexagonal crystal lattice, being formed in vacuo by cathode sputtering and having a structure characterized by close packing of the voids of the lattice by metal ions, said lattice having a space packing above 70% by said metal ions; and a functional friction or slide layer on the diffusion barrier layer, formed by the steps of purifying the coated intermediate layer, by pickling of the free surface of the intermediate layer by means of reverse cathode sputtering in vacuo, followed immediately by cathode sputtering from a target the functional layer while maintaining the temperature of the substrate and the pressure of the plasma to match the desired structure of the diffusion barrier layer.

8. Process according to claim 7, characterized in that during the formation of the diffusion barrier layer the temperature of the substrate at least at the start of the diffusion barrier coat is adjusted to the maximum value permissible for the composition of the intermediate layer and the plasma pressure is adjusted to a value corresponding to the minimum electrical current required for anomalous corona discharge upon applying a selected electrical potential to the target.

9. Process according to claim 7, characterized in that the temperature of the intermediate layer surface to be coated is increased with a progressive build-up of the diffusion barrier layer.

10. Process according to claim 7, characterized in that a negative electrical voltage is applied to the substrate during the formation of the diffusion barrier layer, which voltage is lower by one order of magnitude than that of the negative electrical voltage applied to the target.

11. Process according to claim 7, characterized in that the substrate and the diffusion barrier layer that is being formed are heated by infrared irradiation on the side to be coated.

12. Process according to claim 11, characterized in that the heating of the substrate to the temperature desired at the formation of the diffusion barrier layer is effected by reversed cathode sputtering, thereby to pickle the free surface of the intermediate layer.

13. Process according to claim 7, characterized in that the formation of the diffusion layer is carried out by cathode sputtering in a magnetic field.

14. Process according to claim 7, characterized by subjecting the target to plasma which is to be used for the formation of the diffusion barrier layer by cathode sputtering, and subjecting the material contained in the target to a degassing pretreatment.

15. Process according to claim 14, characterized by subjecting the material contained in the target for the formation of the diffusion barrier layer to a high vacuum degassing pretreatment.

16. Composite structural material, especially for slide and friction members, comprising in combination a substrate layer; an intermediate layer on said substrate layer; a diffusion barrier layer of 0.5 to 5 um thickness on the intermediate layer; characterized in that a functional tin-based friction or slide layer constituted of material selected from the group consisting of tin-containing dispersion alloys is applied to the diffusion barrier layer and further characterized in that the diffusion barrier layer (3) is a material having a hexagonal crystal lattice and is formed in vacuo by cathode sputtering and has a structure characterized by close packing of the voids of the lattice by metal ions, said lattice having a space packing above 70% by said metal ions.

17. Composite structural material in accordance with claim 16, wherein said dispersion alloys are constituted of materials selected from the group consisting of $AlSn_6$, $AlSn_{10}$, $AlSn_{20}$, and $AlSn_{40}$.

18. Composite structural material in accordance with claim 16, wherein said dispersion alloys are constituted of materials selected from the group consisting of AlSn alloys.

* * * * *